(12) United States Patent
Watarai

(10) Patent No.: US 6,288,580 B1
(45) Date of Patent: Sep. 11, 2001

(54) LEVEL-SHIFTING CIRCUIT AND INPUT AND OUTPUT CIRCUITS USING THE SAME

(75) Inventor: Seiichi Watarai, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/458,056

(22) Filed: Dec. 10, 1999

(30) Foreign Application Priority Data

Dec. 15, 1998 (JP) .................................................. 10-356591

(51) Int. Cl.[7] ...................................................... H03B 1/00
(52) U.S. Cl. ............................................. 327/108; 327/390
(58) Field of Search ................................... 327/333, 390, 327/108

(56) References Cited

U.S. PATENT DOCUMENTS 4,717,836 * 1/1988 Doyle ..................................... 307/310
5,786,724 * 7/1998 Teggatz ................................. 327/534

* cited by examiner

*Primary Examiner*—David Nelms
*Assistant Examiner*—M. Tran
(74) *Attorney, Agent, or Firm*—McGuireWoods LLP

(57) ABSTRACT

A level shifting circuit comprises a first insulated-gate transistor which has its gate provided with an input signal and a second insulated-gate transistor which has its drain connected with the source of the first insulated-gate transistor. The second insulated-gate transistor may have the same conductivity type as the first insulated-gate transistor. A voltage not affected by factors such as the manufacturing process used to make the device, operating temperature, or supply voltage is applied to the gate of the second insulated-gate transistor. A ratio of gate channel width to gate channel length for these two insulated-gate transistors are set to a same value, thereby allowing the level-shifting circuit to output a constant predetermined value; and which is not affected by the aforementioned manufacturing process, operating temperature, and supply voltage factors.

49 Claims, 8 Drawing Sheets

LEVEL-SHIFTING CIRCUIT AND INPUT AND OUTPUT CIRCUITS USING THE SAME

BACKGROUND OF THE INVENTION

1. Field of the Invention

The present invention relates to a level-shifting circuit which shifts a level of an input voltage, and input and output circuits using the level-shifting circuit.

2. Description of the Related Art

An example of a conventionally known level-shifting circuit is shown in FIG. 7. This level-shifting circuit 1 comprises: an input terminal 2; an n-channel type MOSFET $N_5$ which has its gate connected to the input terminal 2 and its drain connected to a voltage source $V_{DD}$; a current source CS1 which has its flow-in terminal connected to a source of the n-channel type MOSFET $N_5$ and its flow-out terminal connected to a ground potential; and an output terminal 6 which is connected at a interconnection point between the source of the n-channel type MOSFET $N_5$ and the flow-in terminal of the current source CS1.

The current source CS1 through which a current $I_{DS}$ flows in this level-shifting circuit 1 is employed a constant-current source which is not affected by the manufacturing process, nor the operating temperature, nor the supply voltage.

The operations, explained next, of this level-shifting circuit are described with reference to FIG. 7.

A gate-source voltage $V_{GS}$ of the n-channel type MOSFET $N_5$ when it is provided at its input terminal 2 with a high-level voltage $V_{IN}$ is given by the following Equation 1:

$$V_{GS}=\{2I_{DS}/\beta\}^{1/2}+V_T \qquad 1$$

where $\beta=\mu C_{OX} \times W/L$, $\mu$ is a surface mobility (m2/volt×second), COX is an electrostatic capacitance per unit area of gate channel (farad), $W_1$ is a gate channel width (m) of the n-channel MOSFET $N_1$, and $L_1$ is a gate channel length (m) of the n-channel MOSFET $N_1$.

An output voltage $V_{OUT}$ which appears at the output terminal 6 is given by:

$$V_{OUT}=V_{IN}-V_{GS} \qquad 2$$

Substituting Equation 1 into Equation 2 yields:

$$V_{OUT}=V_{IN}-\{2I_{DS}/\beta\}^{1/2}-V_T \qquad 3$$

There is also provided a small-amplitude interface input circuit which uses this level-shifting circuit. An example of it is shown in FIG. 9.

This small-amplitude interface input circuit 10 comprises: a differential amplifier circuit 12; the level-shifting circuit 1; and a comparator 14. The level-shifting circuit 1 is formed together with the following-stage comparator 14 in the same chip, which comparator 14 is supplied with a supply voltage lower than a VDD for the level-shifting circuit 1 (e.g., 1.8V for the comparator 14 versus 3V for the level-shifting circuit), so that the level-shifting circuit 1 is used to shift the level of an input signal to such a range which can be received by the comparator 14.

The differential amplifier circuit 12 comprises: input terminals 16 and 18; a resistor R3, an n-channel type MOSFET $N_3$ which has its gate connected to the input terminal 16 and its drain connected via the resistor $R_3$ to the voltage source $V_{DD}$; a resistor $R_4$; an n-channel type MOSFET $N_4$ which has its gate connected to the input terminal 18 and its drain connected via the resistor $R_4$ to the voltage source $V_{DD}$; and a current source 20 which has its flow-in terminal connected to sources of the n-channel type MOSFETs $N_3$ and $N_4$ and its flow-out terminal connected to the ground potential.

An output terminal O4 of this differential amplifier circuit 12 (i.e., an interconnection point between the resistor $R_4$ and the source of the n-channel type MOSFET $N_4$) is connected to a gate of an n-channel type MOSFET $N_1$. The level-shifting circuit 1 has the same configuration as that shown in FIG. 7. An output terminal 6 of the level-shifting circuit 1 is connected to an input (+) of the comparator 14. To a reference input (−) of the comparator 14 is connected a voltage source (not shown) which supplies a reference voltage $V_{CP}$. The comparator has its output connected to a CMOS internal circuit 22.

The level-shifting circuit 1 acts to output to the comparator 14 such binary signals as corresponding to a binary value represented by two signals INA and INB (both of which are shown in FIG. 10) mutually opposite in phase and different in voltage level which are transmitted via a transmission line and received at the separate input terminals 16 and 18 of the differential amplifier circuit 12.

That is, of the signals INA and INB (both of which are shown in FIG. 10) applied separately at the input terminals 16 and 18 respectively, the signal INB which is differential-amplified at the differential amplifier circuit 12 is supplied from the output terminal 04 of the differential amplifier circuit 12 to the level-shifting circuit 12 at its input terminal 2, where the INB signal is shifted in level to such a signal $V_{OUT}1$ (which is shown in FIG. 10) that can be received by the comparator 14, and then output from the output terminal 6 of the level-shifting circuit 1.

If the output signal $V_{OUT}1$ is sequentially input as an idealistic signal having the reference voltage $V_{CP}$ as its center of amplitude as shown in FIG. 10 as $V_{OUT}1S$ of $V_{OUT}1$, since the reference voltage $V_{CP}$ is applied to the comparator at its reference input (−), the comparator 14 sequentially outputs a binary signal having such a waveform as $V_{OUT}2(1)$ in FIG. 10, which signal is then processed in the CMOS internal circuit 22.

Therefore, that signal processing has no inconvenience at all.

Also, an example of the small-amplitude interface input circuit is shown in FIG. 11.

This small-amplitude interface input circuit 30 comprises: a differential amplifier circuit 32; a level-shifting circuit 34; and a differential amplifier circuit 36, in such a configuration that the level-shifting circuit 34 has two level-shifting circuits, each of which has the same configuration as that shown in FIG. 7, connected separately to the output terminals O3 and O4 of the differential amplifier circuit 32. The differential amplifier circuit 32 has the same configuration as that shown in FIG. 9. The level-shifting circuit 34 is configured of two level-shifting circuits each of which is shown in FIG. 7, in such a way that a first level-shifting circuit $34_1$ consists of an n-channel type MOSFET $N_1$ and a constant current source $CS1_1$, while a second level-shifting circuit $34_2$ consists of an n-channel type MOSFET $N_2$ and a constant current source $CS1_2$.

With this, the level-shifting circuit is formed together with the following-stage differential amplifier circuit 36 in the same chip, which differential amplifier circuit 36 is supplied with a $V_{DD}$ lower than a voltage source for the level-shifting circuit 34 (e.g., 1.8V for the differential amplifier circuit 36 versus 3V for the level-shifting circuit 34), so that the level-shifting circuit 34 is used to shift a signal supplied to the differential amplifier circuit 36 to such a range of level that can be received by the differential amplifier circuit 36. The reason why the level-shifting circuit 34 is used in this small-amplitude interface input circuit 30 is that if the differential amplifier circuit 36 connected at the stage following the level-shifting circuit 34 is supplied with a signal having a potential of the voltage source $V_{DD}$ or higher (e.g., if a signal having 2.5V as its signal amplitude center as against $V_{DD}$=1.8V is supplied via a bus line), it is rendered inoperative, so that to prevent such an event from occurring, a level of signals supplied to the differential amplifier circuit 36 must be shifted to such a range of level that can be received by the differential amplifier circuit 36.

Like that shown in FIG. 9, this small-amplitude interface input circuit 30 also causes the differential amplifier circuit 36 to output binary signals which correspond to binary values represented by two signals INA and INB mutually opposite in phase and different in voltage level which are received via the transmission line at the input terminals 16 and 18 of the differential amplifier circuit 32.

That is, the signals INA and INB separately applied at the input terminals 16 and 18 are amplified at the differential amplifier circuit 32 and then respectively applied at gates of the n-channel type MOSFETs $N_1$ and $N_2$ of the level-shifting circuit 34. Respectively from an output terminal 6₁ connected to an interconnection point between a source of the n-channel type MOSFET $N_1$ and the constant current source $CS1_1$ and an output terminal 6₂ connected to an interconnection point between a source of the n-channel type MOSFET $N_2$ and the constant current source $CS1_2$, signals mutually opposite in phase and different in voltage level which have been shifted in level by as much as a predetermined quantity are output and applied to the (+) and (−) input terminals of the differential amplifier circuit 36 respectively.

If, in this case, the level-shifting quantity for the signal applied at the (+) input of the differential amplifier circuit 36 is idealistically the same as that for the opposite-phase signal applied at the (−) input and, therefore, two signals which are mutually opposite in phase and different in voltage level are output from the level-shifting circuit 34 and applied to the differential amplifier circuit 36 at its (+) and (−) input terminals, when a level of voltage applied at the (+) input of the differential amplifier circuit is higher than that applied at its (−) input, the differential amplifier circuit 36 provides an output having a higher voltage level and, when a voltage level applied at the (+) input of the differential amplifier circuit 36 is lower than that applied at its (−) input, the differential amplifier circuit 36 provides an output having a lower voltage level. Thus, binary signals are output from the differential amplifier circuit which correspond to binary values represented by the two signals INA and INB mutually opposite in phase and different in voltage level which are input to the differential amplifier circuit 36 at its input terminals 16 and 18. These two signals are held in an idealistic time-wise relationship with the two input signals INA and INB which are mutually opposite in phase and different in voltage level; that is, these two signals have the same signal time-axis width as that of the signals INA and INB, so that even when subjected to signal processing at the CMOS internal circuit 38, these two signals give no inconvenience at all to that signal processing.

There is also shown in FIG. 12 another example of the small-amplitude interface input circuit.

This small-amplitude interface input circuit 40 comprises a level-shifting circuit 42 and a differential amplifier circuit 36. The level-shifting circuit 42 consists of two level-shifting circuits 42₁ and 42₂, each of which has the same configuration as that shown in FIG. 7, in such a configuration that the first level-shifting circuit 42₁ consists of an n-channel type MOSFET $N_1$ and a constant current source $CS1_1$ and the second level-shifting circuit 42₂ consists of an n-channel type MOSFET $N_2$ and a constant current source $CS1_2$. These two level-shifting circuits are so configured that they are provided, at their respective input terminals 2₁ and 2₂, with two input signals INA and INB mutually opposite in phase and different in voltage level, via the transmission line, and also that their respective output terminals 6₁ and 6₂ are connected to (−) and (+) inputs of the differential amplifier circuit 36 respectively.

The reason why the level-shifting circuit 42 is used in this small-amplitude interface input circuit 40 is that since the differential amplifier circuit 36 connected at the stage following the level-shifting circuit 42 is rendered inoperative if it is supplied with a signal having a potential of the voltage source $V_{DD}$ or higher (e.g., if it is supplied via a bus line with a signal having 2.5V as its signal amplitude center versus $V_{DD}$=1.8v), the signals supplied to the differential amplifier circuit 36 must be shifted to such a range of level that can be received by that differential amplifier circuit 36.

Thus configured small-amplitude interface input circuit 40 also causes, like those shown in FIGS. 9 and 11, the differential amplifier circuit 36 to output binary signals which correspond to binary values represented by the two input signals INS and INB mutually opposite in phase and different in voltage level which are input to the level-shifting circuits 42₁ and 42₂ at their respective input terminals 2₁ and 2₂.

That is, the signals INA and INB applied to the level-shifting circuits 42₁ and 42₂ at their respective input terminals 2₁ and 2₂ are shifted in level at these level-shifting circuits 42₁ and 42₂ respectively, so that the resultant signals which are mutually opposite in phase and different in voltage level are output respectively from the output terminal 6₁ connected to an interconnection point between a source of the n-channel type MOSFET $N_1$ and the constant current source $CS1_1$ and the output terminal 6₂ connected to an interconnection point between a source of the n-channel type MOSFET $N_2$ and the constant current source $CS1_2$ and applied to the differential amplifier circuit 36 at its (+) and (−) inputs respectively.

If a level-shifting quantity for the signal applied to that differential amplifier circuit at its (+) input is idealistically the same as that for that opposite-phase signal applied at its (−) input and, at the same time, two signals mutually opposite in phase and different in voltage level which are output from the level-shifting circuit 42 are applied to the differential amplifier circuit 36 at its (+) and (−) inputs respectively, when a level of voltage applied to the (+) input is higher than that applied to the (−) input, the differential amplifier circuit 36 outputs a higher level of voltage and, when the level of voltage applied to the (+) input is lower than that applied to the (−) input, the differential amplifier circuit 36 outputs a lower level of voltage. Thus, the differential amplifier circuit 36 outputs binary signals which correspond to binary values represented by the two signals INA and INB mutually opposite in phase and different in voltage level which are input to the level-shifting circuits 42₁ and 42₂ at their respective input terminals 2₁ and 2₂. These binary signals are held in an idealistic time-wise relationship with the two input signals INA and INB which are mutually opposite in phase and different in voltage level; that is, since these binary signals have the same signal time-axis width as that for the signals INA and INB, they inflict no inconvenience on the CMOS internal circuit when it performs signal processing on them.

There is also provided another small-amplitude interface input circuit which uses the above-mentioned level-shifting circuit. An example of it is shown in FIG. 13.

This small amplitude interface output circuit 50 has roughly the same configuration as the small-amplitude interface input circuit 30 shown in FIG. 11.

The output circuit 50 shown in FIG. 13 is different from the input circuit 30 shown in FIG. 11 in that its level-shifting circuit 34 has its output terminals $6_1$ and $6_2$ connected to a load resistor 54 via a transmission line 52 and also in that in order to drive the load connected to a bus line at a high speed because of its being an output circuit, its transistors (e.g., n-channel type MOSFETs $N_1$, $N_2$, $N_3$, and $N_4$) have a large size and its constant current values (e.g., those for $CS1_1$, $CS1_2$, and 20) have a large magnitude.

With this, in FIG. 13 and other figures, like components are indicated by the same reference numerals, so that their description is omitted here.

The operations of the small-amplitude interface output circuit are also roughly the same as well.

That is, two signals INA and INB mutually opposite in phase and different in voltage level which are separately input at the input terminals 16 and 18 are amplified at the differential amplifier circuit 32 and applied to the gates of the respective n-channel type MOSFETs N1 and $N_2$ of the level-shifting circuit 34. Respectively from the output terminals $6_1$ connected to an interconnection point between a source of the n-channel type MOSFET $N_1$ and the constant current source $CS1_1$ and the output terminal $6_2$ connected to an interconnection point between a source of the n-channel type MOSFET $N_2$ and the constant current source $CS1_2$ are output and respectively supplied to a load resistor 54 such signals mutually opposite in phase and different in voltage level which have been shifted in level by a predetermined quantity. The load resistor 54 is configured to operate normally when supplied with such a prescribed voltage level of signals.

Therefore, the load resistor 54 operates normally as far as the level-shifting quantity given by the level-shifting circuit is not affected by fluctuations in the process nor the temperature.

Note here that terms in Equation 3, particularly $V_T$ and $\mu$ will vary with fluctuations in the properties and the operating temperature during the manufacturing processes.

Supposing here that $V_{IN}$=3.0V (V represent voltage value) and $\{2I_{DS}/\beta\}^{1/2}$=1V, and $V_T$=0.5V in the conditions of certain manufacturing processes and operating temperature, $$V_{OUT}=3.0V-1.0V-0.5V=1.5V$$

is given (see FIG. 8A), while supposing the above-mentioned certain manufacturing process and operating temperature have changed to 0.8V from 0.5V of the $V_T$ value and to 0.8 times on the $\mu$ value, $$V_{OUT}=3.0V-1.12V-0.8V=1.08V,$$

is obtained (see FIG. 8B), so that these results cannot meet an originally expected operational requirement of the level-shifting circuit that even when the manufacturing process and the operating temperature have been changed, the same output voltage $V_{OUT}$ be obtained. That is, the level-shifting quantity for the output voltage $V_{OUT}$ varies.

Thus, the above-mentioned conventional level-shifting circuits have a disadvantage of not being capable of obtaining a predetermined level-shifting quantity.

Also, such a disadvantage may occur even with fluctuations in the supply voltage.

Since such a disadvantage is involved in the level-shifting circuit 1 shown in FIG. 7, the small-amplitude interface input circuit using this level shifting circuit 1 shown in FIG. 9 also has a problem due to fluctuations in the level-shifting quantity for the level-shifted signal output from the level-shifting circuit 1 which are caused by fluctuations in the manufacturing process, the operating temperature, and the supply voltage.

That is, if, caused by fluctuations in the manufacturing process, the operating temperature, and the supply voltage, the level-shifted signal rises in voltage level from $V_{OUT}1S$ which has an appropriate level-shifting quantity of $V_{OUT}1$ shown in FIG. 10 up to $V_{OUT}1U$ of $V_{OUT}1$ shown in the same figure, and is compared, as level-shifted, to the reference voltage $V_{CP}$ at the comparator 14, the comparator 14 outputs such a binary signal as represented by $V_{OUT}2$ (2) in FIG. 10.

As a result, thus output binary signal has a larger signal width than that of a normal signal width (i.e., $V_{OUT}2$ (1) in FIG. 10); that is, a skew occurs at the binary signal, thus causing the CMOS internal circuit 22 to malfunction when it has received this signal.

If, conversely, caused by fluctuations in the manufacturing process and the operating temperature, the level-shifted signal falls in voltage from $V_{OUT}1S$ which has an appropriate level-shifting quantity of $V_{OUT}1$ shown in FIG. 10 down to $V_{OUT}1D$ of $V_{OUT}1$ in the same figure and compared, as level-shifted, to the reference voltage VCP at the comparator 14, the comparator 14 outputs such a binary signal as represented by $V_{OUT}2$ (3) shown in FIG. 10.

As a result, thus output binary signal has a smaller signal width than that of a normal signal (i.e., $V_{OUT}2$ (1) in FIG. 10); that is, a skew occurs at the binary signal, thus also causing the CMOS internal circuit to malfunction.

The small-amplitude interface input circuits shown in FIGS. 11 and 12 also suffer from such a skew-related problem as having been described for the small-amplitude interface input circuit 10 shown in FIG. 9, i.e. a problem that fluctuations in the manufacturing process, the operating temperature, and the supply voltage bring about fluctuations in the level-shifting quantity for level-shifted signals output from the level-shifting circuit 1. Since in FIGS. 11 and 12 the following-stage is a differential amplifier circuit 36, it does not have such a skew as related to the reference level but does it have such a skew as caused by fluctuations in a so-called off-set voltage.

That is, when the manufacturing process, the operating temperature, or the supply voltage has changed, the resultant signal as level-shifted would rise or fall from a normal signal level.

In such a case, also in the small-amplitude interface input circuit 30 shown in FIG. 11 as well as in the small-amplitude interface input circuit 40 shown in FIG. 12, if there is no difference in terms of fluctuations in the level-shifting quantity between a signal level applied to the (+) input and the (−) input of the differential amplifier circuit 36, there is no difference either between a binary signal obtained by differential-amplifying at the differential amplifier circuit 36 those signals immediately after being level-shifted by a level-shifting quantity different from a normal level-shifting quantity and another binary signal obtained by differential-amplifying at the differential amplifier circuit 36 those signals immediately being level-shifted by the normal level-shifting quantity.

If, however, there occurs a difference in terms of level-shifting quantity between the level-shifting circuits $34_1$ and 34₂ as well as between the level-shifting circuits 42₁ and 42₂, as mentioned above, there occurs a problem of not a skew caused by the reference but a skew caused by fluctuations in the offset voltage.

Therefore, there is brought about a disadvantage in that the CMOS internal circuit may malfunction when it has received such a binary signal as having a skew.

Moreover, the small-amplitude interface output circuit shown in FIG. 13 also suffers from such a problem that fluctuations in the level-shifting quantity may cause an output signal having a level-shifting quantity different from the normal level-shifting quantity to be output from the small-amplitude interface output circuit. If such a level-shifting quantity fluctuates, the small-amplitude interface input circuit 50 may malfunction which should operate normally when supplied with an input signal having a prescribed level-shifting quantity, which leads to another disadvantage.

To avoid such disadvantages, conventionally, values of the level-shifting quantity and an input voltage at which the following-stage circuit does not malfunction are obtained beforehand, so that such level-shifting values may be set not to permit that input voltage to be deviated. There are two methods for adjusting the level-shifting quantity for this purpose: a first method of adjusting a current Ids flowing through the constant current source and a second method of adjusting the value of β of the n-channel type MOSFET $N_5$. In order to increase the level-shifting quantity, for example by the first method, the drain current $I_{DS}$ may be increased and, by the second method, the value of a β related term, for example, W may be decreased.

By the first method, whereby the effect of increases in $I_{DS}$ works in proportional to its square root, in order to roughly double the level-shifting quantity, the drain current $I_{DS}$ must be increased four times as much. This leads to another disadvantage of increasing power dissipation.

This changing method, therefore, is very disadvantageous in adopting in such a field as for example battery-driven integrated circuits, which are strongly required for saving on power dissipation.

By the second method, on the other hand, the output impedance of the n-channel MOSFET $N_5$ is increased, thus deteriorating the high-speed performance, which leads to another disadvantage.

The second method, therefore, cannot be adopted in such integrated circuits which handle high-speed signals.

Thus, although the level-shifting quantity can be changed by either of these two changing methods, a problem of fluctuations in the level-shifting quantity caused by fluctuations in the manufacturing process, the operating temperature, or the supply voltage is still left unsolved.

SUMMARY OF THE INVENTION

In view of the above, it is an object of the present invention to provide a level-shifting circuit that can output a signal which has been shifted in level by as much as a predetermined level-shifting quantity even with fluctuations in the manufacturing process, the operating temperature, or the supply voltage and also to provide input and output circuits which use such a level-shifting circuit.

According to a first aspect of the present invention, there is provided a level-shifting circuit in which a source of a first insulated-gate transistor is connected with a drain of a second insulated-gate transistor having a same conductivity type as the first insulated-gate transistor, to apply an input signal to a gate of the first insulated-gate transistor in order to output an output signal obtained by level-shifting the input signal by a desired quantity from an interconnection point between the first insulated-gate transistor and the second insulated-gate transistor, wherein the first insulated-gate transistor and the second insulated-gate transistor share a same value of a ratio of a gate channel width to a gate channel length, in such a configuration that a constant voltage may be applied to a gate of the second insulated-gate transistor.

In the foregoing first aspect, a preferable mode is one wherein the gate of the second insulated-gate transistor is provided with the constant voltage which is not affected by a variation in a property, an operating temperature, or an operating voltage which is caused by a fluctuation in a manufacturing process for the first insulated-gate transistor and the second insulated-gate transistor.

Also, a preferable mode is one wherein the two insulated-gate transistors share a same value given by a following Equation 4:

$$(1/T) \times W/L \qquad 4$$

where T is a thickness of a gate insulator film, W is a gate channel width, and L is a gate channel length.

Also, a preferable mode is one wherein the two insulated-gate transistors shares a value give by a following Equation 5:

$$\mu \times \in_r \times (S/T) \times W/L \qquad 5$$

where $\mu$ is a surface mobility, $\in_r$ is a dielectric constant of a gate insulator film, and S is a unit area of a gate channel.

Also, a preferable mode is one wherein the two insulated-gate transistors are formed on a same substrate, in such a configuration that the constant voltage may be supplied from an outside of the substrate.

Also, a preferable mode is one wherein the two insulated-gate transistors are formed on a same substrate, in such a configuration that the constant voltage may be an arbitrary constant voltage which is created based on a band-gap reference voltage which is generated in the substrate.

Also, a preferable mode is one wherein the two insulated-gate transistors are formed on a same substrate, in such a configuration that, in each of the insulated-gate transistors, a source and a back-gate are interconnected.

Also, a preferable mode is one wherein the two insulated-gate transistors are formed on a same substrate, in such a configuration that, in neither of the insulated-gate transistors, a source and a back-gate are interconnected.

Further, a preferable mode is one wherein the two insulated-gate transistors are formed on a same substrate, in such a configuration that a back-gate of each of the insulated-gate transistors is clamped to a highest or lowest potential supplied to the substrate.

According to a second aspect of the present invention, there is provided an input circuit which shifts a level of a voltage of a signal output from a preceding-stage circuit by as much as a level-shifting quantity to such an input operating level as required by a following-stage circuit which is provided with an operating voltage different from an operating voltage for the preceding-stage circuit, wherein the input circuit comprises a level-shifting circuit in which a first insulated-gate transistor and a second insulated-gate transistor having a same conductivity type as the first insulated-gate transistor are interconnected to apply an input signal to a gate of the first insulated-gate transistor, in order to output an output signal obtained by shifting a level of the input signal by a desired quantity from an interconnection point between the first insulated-gate transistor and the second insulated-gate transistor; and the first insulated-gate transistor and the second insulated-gate transistor share a same value of a ratio of a gate channel width to a gate channel length, in such a configuration that a constant voltage may be applied to a gate of the second insulated-gate transistor.

In the foregoing second aspect, a preferable mode is one that wherein has such a configuration that a gate of the second insulated-gate transistor may be provided with the constant voltage which is not affected by a variation in a property or an operating temperature caused by a fluctuation in a manufacturing process of the first insulated-gate transistor and the second insulated-gate transistor.

Also, a preferable mode is one wherein the two insulated-gate transistors share a same value which is given by a following Equation 6:

$$(1/T) \times W/L \qquad 6$$

Also, a preferable mode is one wherein the two insulated-gate transistors share a same value which is given by a following Equation 7:

$$\mu \times \in_r \times (S/T) \times W/L \qquad 7$$

Also, a preferable mode is one wherein the two insulated-gate transistors are formed on a same substrate, in such a configuration that the constant voltage may be supplied from an outside of the substrate.

Also, a preferable mode is one wherein the two insulated-gate transistors are formed on a same substrate, in such a configuration that the constant voltage may be an arbitrary constant voltage created based on a band-gap reference voltage generated in the substrate.

Also, a preferable mode is one wherein the two insulated-gate transistors are formed on a same substrate, in such a configuration that in each of the insulated-gate transistors, a source and a back-gate are interconnected.

Also, a preferable mode is one wherein the two insulated-gate transistors are formed on a same substrate, in such a configuration that in neither of the insulated-gate transistors, a source and a gate are interconnected.

Also, a preferable mode is one wherein the two insulated-gate transistors are formed on a same substrate, in such a configuration that in each of the insulated-gate transistors, a back-gate is clamped to a highest-level or lowest-level potential supplied to the substrate.

Further, a preferable mode is one wherein the preceding-stage circuit is a differential amplifier circuit which is supplied with two signals mutually opposite in phase and different in voltage level, to output one output signal to one output terminal, the level-shifting circuit has one input terminal and one output terminal, the following-stage circuit is a comparator which is provided with a reference voltage at one input terminal thereof, the one output of the differential amplifier circuit is connected to one input terminal of the level-shifting circuit, and one output terminal of the level-shifting circuit is connected to the other input terminal of the comparator.

Furthermore, a preferable mode is one wherein the preceding-stage circuit is a differential amplifier circuit which has two input terminals and two output terminals, the level-shifting circuit has two input terminals and two output terminals, the following-stage circuit is a differential amplifier circuit which has two input terminals, the preceding-stage amplifier circuit is supplied with two input signals opposite in phase and different in voltage level and has two output terminals thereof connected to corresponding input terminals of the level-shifting circuit, and the two output terminals of the level-shifting circuit are connected to corresponding input terminals of the following-stage differential amplifier circuit.

According to a third aspect of the present invention, there is provided an input circuit which shifts by a level-shifting quantity a level of a voltage of input signals which is required as an input operating level of an output stage and then supplies a signal thus level-shifted to the output stage, wherein the input circuit comprises a level-shifting circuit in which a source of a first insulated-gate transistor and a drain of a second insulated-gate transistor having a same conductivity type as the first insulated-gate transistor are interconnected to apply an input signal to a gate of the first insulated-gate transistor, in order to output an output signal obtained by shifting a level of the input signal by a desired quantity from an interconnection point between the first insulated-gate transistor and the second insulated-gate transistor; and the first insulated-gate transistor and the second insulated-gate transistor share a same value of a ratio of a gate channel width to a gate channel length, in such a way that a constant voltage may be applied to a gate of the second insulated-gate transistor.

In the foregoing third aspect, a preferable mode is one that wherein has such a configuration that a gate of the second insulated-gate transistor may be provided with the constant voltage which is not affected by a variation in a property or an operating temperature caused by a fluctuation in a manufacturing process for the first insulated-gate transistor and the second insulated-gate transistor.

Also, a preferable mode is one wherein the two insulated-gate transistors share a same value given by a following Equation 8:

$$(1/T) \times W/L \qquad 8$$

Also, a preferable mode is one wherein the two insulated-gate transistors share a same value given by a following Equation 9:

$$\mu \times \in_r \times (S/T) \times W/L \qquad 9$$

Also, a preferable mode is one wherein the two insulated-gate transistors are formed on a same substrate, in such a configuration that the constant voltage may be applied from an outside of the substrate.

Also, a preferable mode is one wherein the two insulated-gate transistors are formed on a same substrate, in such a configuration that the constant voltage may be an arbitrary constant voltage created based on a band-gap reference voltage generated in the substrate.

Also, a preferable mode is one wherein the two insulated-gate transistors are formed on a same substrate, in such a configuration that in each of the insulated-gate transistors, a source and a back-gate are interconnected.

Further, a preferable mode is one wherein the two insulated-gate transistors are formed on a same substrate, in such a configuration that in neither of the insulated-gate transistors, a source and a back-gate are interconnected.

Furthermore, a preferable mode is one wherein the two insulated-gate transistors are formed on a same substrate, in such a configuration that a back-gate of each of the insulated-gate transistors is clamped to a highest-level or lowest-level potential supplied to the substrate.

Still furthermore, a preferable mode is one wherein the level-shifting circuit has two input terminals provided with two signals opposite in phase and different in voltage level are supplied, and two output terminals, the output stage is a differential amplifier circuit which has two input terminals, and the two output terminals of the level-shifting circuit are connected to corresponding input terminals of the output stage.

Also, according to a fourth aspect of the present invention, an output circuit which shifts a level of a signal output from an input stage by a predetermined level-shifting quantity and then outputs the signal, wherein the output circuit comprises a level-shifting circuit in which a source of a first insulated-gate transistor and a drain of a second insulated-gate transistor having a same conductivity type as the first insulated-gate transistor to apply an input signal to a gate of the first insulated-gate transistor, in order to output an output signal obtained by shifting a level of the input signal by a desired quantity from an interconnection point between the first insulated-gate transistor and the second insulated-gate transistor; and the first insulated-gate transistor and the second insulated-gate transistor share a same value of a ratio of gate channel width to a gate channel length, in such a configuration that a constant voltage may be applied to a gate of the second insulated-gate transistor.

In the foregoing fourth aspect, a preferable mode is one wherein the gate of the second insulated-gate transistor is provided with the constant voltage which is not affected by a variation in a property or an operating temperature caused by a fluctuation in a manufacturing process for the first insulated-gate transistor and the second insulated-gate transistor.

Also, a preferable mode is one wherein the two insulated-gate transistors share a same value given by a following Equation 1:

$$(1/T) \times W/L \qquad 10$$

Also, a preferable mode is one wherein the two insulated-gate transistors share a same value given by a following Equation 11, in such a configuration that a gate of the other insulated-gate transistor may be provided with a constant voltage which is not affected by a fluctuation in a process or a temperature:

$$\mu \times \in_r (S/T) \times W/L \qquad 11$$

Also, a preferable mode is one wherein the two insulated-gate transistors are formed on a same substrate, in such a configuration that the constant voltage may be supplied from an outside of the substrate.

Also, a preferable mode is one wherein the two insulated-gate transistors are formed on a same substrate, in such a configuration that the constant voltage may be an arbitrary constant voltage created based on a band-gap reference voltage generated in the substrate Also, a preferable mode is one wherein the two insulated-gate transistors are formed on a same substrate, in such a configuration that in each of the insulated-gate transistors a source and a back-gate are interconnected.

Also, a preferable mode is one wherein the two insulated-gate transistors are formed on a same substrate, in such a configuration that in neither of the insulated-gate transistors, a source and a back-gate are interconnected.

Also, a preferable mode is one wherein a back-gate of each of the insulated-gate transistors is clamped to a highest-level or lowest-level potential supplied to the substrate.

Also, a preferable mode is one wherein the input stage is a differential amplifier circuit which has two input terminals and two output terminals, the level-shifting circuit has two input terminals and two output terminals which are connected to two input terminals of a load circuit, and the differential amplifier circuit has the two input terminals thereof supplied with two signals which are mutually opposite in phase and different in voltage level and the two output terminals thereof connected to the two input terminals of the level-shifting circuit.

With the configuration of the present invention, there is provided such a level-shifting circuit that removes the variation factors of the insulated-gate transistors which bring about fluctuations in a level-shifting quantity depending on the manufacturing process, the operating temperature, and the supply voltage, in such a way that during the removal, no factors are allowed to increase power dissipation or deteriorate high-speed performance of the circuit in contrast to the conventional methods for changing the level-shifting quantity. In addition, that configuration makes it possible to set the level-shifting quantity for the level-shifting circuit in a voltage value, thus arbitrarily changing the level-shifting quantity in voltage.

Also, when this level-shifting circuit is applied in a small-amplitude interface input circuit, the level-shifting quantity for the level-shifting circuit is not dependent on the manufacturing process, the operating temperature, or the supply voltage, so that fluctuations in those factors give no skew to binary signals output from that input circuit, thus preventing a circuit connected to that input circuit from malfunctioning.

Also, a small-amplitude interface input circuit using the above-mentioned level-shifting circuit has an advantage in such an application field as requiring low power dissipation or high-speed performance.

Moreover, when this level-shifting circuit is applied in a small-amplitude interface output circuit, a level-shifting quantity for the level-shifting circuit is not dependent on the manufacturing process, the operating temperature, or the supply voltage, so that their fluctuations may not give rise to such output signals mutually opposite in phase and different in voltage level, from that output circuit, that are level-shifted beyond a predetermined level-shifting quantity, thus preventing a load circuit connected to that output circuit from malfunctioning.

Also, a small-amplitude interface output circuit using the above-mentioned level-shifting circuit has an advantage in such an application field as requiring low power dissipation or high-speed performance.

DESCRIPTION OF THE PREFERRED EMBODIMENTS

The following will describe the embodiments of the present invention with reference to the appended drawings. The description is made specifically using the embodiments.

First Embodiment

Figure 1:
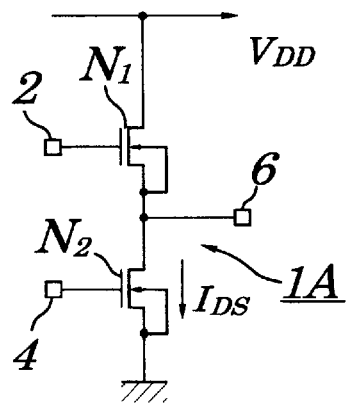
FIG. 1 is a circuit diagram showing a configuration of a level-shifting circuit according to a first embodiment of the present invention.

A level-shifting circuit 1A, FIG. 1, in this embodiment, related to a level-shifting circuit capable of outputting an output voltage as shifted by a predetermined level-shifting quantity even with fluctuations in the process or the temperature, comprises: a first input terminal 2; an n-channel type MOSFET $N_1$ which has its gate connected to the first input terminal 2 and its drain connected to a voltage source $V_{DD}$; another n-channel type MOSFET $N_2$ which has its drain connected to a source of the n-channel type MOSFET $N_1$, its gate connected to a second input terminal 4 to be connected to the constant voltage source, and its source connected to the ground; and an output terminal 6 connected to an interconnection point between the source of the n-channel MOSFET $N_1$ and the drain of the n-channel MOSFET $N_2$, in such a configuration that these n-channel MOSFETs $N_1$ and $N_2$ are formed on the same substrate. To insulate the gates of these MOSFETs, a silicon oxide film is used. Also, a voltage $V_R$ of the constant voltage source is set at such a constant value as not depending on the manufacturing process, the operating temperature, nor the supply voltage. The voltage $V_R$ may be supplied from an outside of the chip or be an in-chip band-gap voltage or an arbitrary value obtained by stepping up or down that band-gap voltage.

The n-channel MOSFETs $N_1$ and $N_2$ are formed so that their $\beta_1$ and $\beta_2$ values may be equal to each other. The $\beta_1$ value of the n-channel MOSFET $N_1$ is given by the following Equation 12 and The $\beta_2$ value of the n-channel MOSFET $N_2$ is given by the following Equation 13:

$$\beta_1 = \mu C_{OX} \times W_1/L_1 \qquad 12$$

$$\beta_2 = \mu C_{OX} \times W_2/L_2 \qquad 13$$

where $\mu$ is a surface mobility (m2/volt×second), COX is an electrostatic capacitance per unit area of gate channel (farad), $W_1$ is a gate channel width (m) of the n-channel MOSFET $N_1$, and $L_1$ is a gate channel length (m) of the n-channel MOSFET $N_1$.

$C_{OX}$ is given by the following Equation 14:

$$C_{OX} = \in_0 \times \in_r \times S/T_{OX} \qquad 14$$

Where $\in_0$ is a permittivity of a vacuum (farad/m), $\in_r$ is a dielectric constant of a silicon oxide film, S is a unit area of a gate channel (m²), and $T_{OX}$ is a thickness of the silicon oxide film (m).

The n-channel MOSFETs $N_1$ and $N_2$ each have their back gates (region for forming elements therein) and sources connected to each other.

Figure 2:
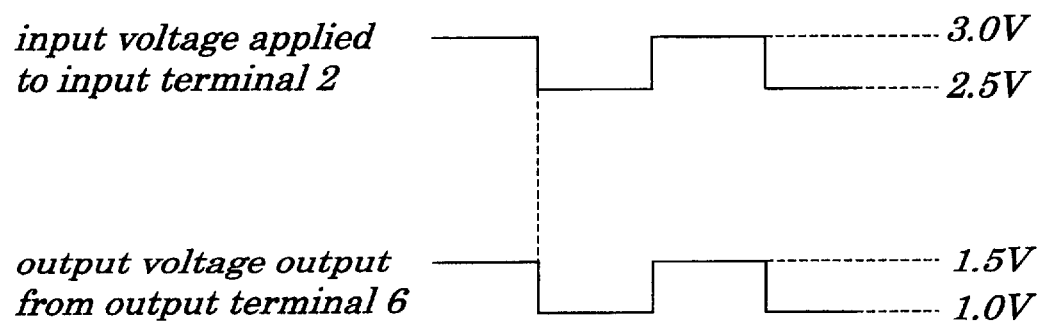
FIG. 2 shows operating waveforms of the same level-shifting circuit as shown in FIG. 1.

Next, the following will describe the operations of this embodiment with reference to FIGS. 1 and 2.

When a high-level voltage $V_{IN}$ is input at the first input terminal 2 and the voltage $V_R$ is input at the second input terminal 4, that voltage $V_R$ is applied between the gate and the source of the n-channel type MOSFET $N_2$, causing a current $I_{DS}$ given by the following Equation 15 to flow through the n-channel type MOSFETs $N_1$ and $N_2$:

$$I_{DS} = \frac{1}{2}\beta_2(V_{GS}-V_T)^2 \qquad 15$$

The gate-source voltage $V_{GS}$ in Equation 15 is given by the following Equation 16:

$$V_{GS} = \{2I_{DS}/\beta_2\}^{1/2} + V_T \qquad 16$$

By setting the voltage $V_R$ applied to the gate of the n-channel type MOSFET $N_2$ equal to a value of the gate-source voltage $V_{GS}$ which determines a value of the current $I_{DS}$ which is set as mentioned above, the following Equation 17 is obtained:

$$I_{DS} = \frac{1}{2}\beta_2(V_{GS}-V_T)^2 = \frac{1}{2}\beta_2(V_R-V_T)^2 \qquad 17$$

In this embodiment also, an output voltage $V_{OUT}$ which appears at the output terminal 6 is, like in the case of conventional circuits, given by the following Equation 18:

$$V_{OUT} = V_{IN} - V_{GS} \qquad 18$$

By substituting Equation 18 into Equations 16 and 17, the following Equation 19 is obtained:

$$V_{OUT} = V_{IN} - \{[2\times\frac{1}{2}\beta_2(V_R-V_T)^2/\beta_1]^{1/2}+V_T\} = V_{IN} - [\beta_2/\beta_1]^{1/2}(V_R-V_T) - V_T \qquad 19$$

Since the n-channel type MOSFETs $N_1$ and $N_2$ are formed in such a way that the $\beta_1$ of the former transistor may be equal to $\beta_2$ of the latter transistor, that is, a ratio of the gate channel width $W_1$ to the gate channel length $L_1$ of the former may be equal to a ratio of the gate channel width $W_2$ to the gate channel length $L_2$ of the latter, so that the output voltage $V_{OUT}$ of the level-shifting circuit in this embodiment is as follows:

$$V_{OUT} = V_{IN} - V_R \qquad 20$$

Since $V_R$ is set at a value which is not dependent on the manufacturing process, the operating temperature, nor the supply voltage, the $V_{OUT}$ also does not vary with them. That is, a level-shifting quantity for the level-shifting circuit 1A does not vary with the manufacturing process, the operating temperature, nor the supply voltage.

Thus, in such a configuration, the output voltage $V_{OUT}$ provided from the level-shifting circuit 1A can be output as a voltage not dependent on the manufacturing process, the operating temperature, nor the supply voltage. That is, even if the manufacturing process, the operating temperature, or the supply voltage may fluctuate, the output voltage $V_{OUT}$ having no fluctuations in the level-shifting quantity can be output from the level-shifting circuit 1A.

Also, as can be seen from Equation 20, the level-shifting quantity can be adjusted at an arbitrary set-point value by adjusting the constant voltage $V_R$. In addition, that setting need not change a current flowing through the NMOS transistors nor the gate width W, thus inflicting, unlike the conventional embodiments, no disadvantage which brings about increases in power dissipation or deterioration in high-speed performance of the level-shifting circuit.

If, for example, $V_R$=1.5v, then $V_{OUT}$=3V−1.5V=1.5V (see FIG. 2). This technological significance is that in contrast to the conventional circuits, whereby, as described with reference to FIG. 9, the level-shifting quantity may fluctuate in such a way that $V_{OUT}$=0.95V caused by fluctuations in the manufacturing process, the operating temperature, or the supply voltage, the level-shifting circuit according to this embodiment brings about no fluctuations in the level-shifting quantity even with fluctuations in the manufacturing process, the operating temperature, or the supply voltage, thus making it possible to output a value of 1.5V from itself, which is originally a desired output $V_{OUT}$.

Second Embodiment

In this embodiment, the level-shifting circuit 1A (FIG. 1) used in the first embodiment is applied to shift the level of a voltage between a differential amplifier circuit 12 and a comparator 14 in a small-amplitude interface input circuit 10A, in order to match a voltage level of a signal output from the input-stage differential amplifier circuit 12 with a voltage level of a signal input to the output-stage comparator in the small-amplitude interface input circuit 10A.

Since that level-shifting circuit 1A is formed together with the following-stage comparator 14 in the same chip and that comparator 14 is supplied with a $V_{DD}$ lower than a supply voltage for the level-shifting circuit 1A (e.g., 1.8V for the comparator 14 versus 3V for the level-shifting circuit 1A), that level-shifting circuit 1A is used to shift the level of an input signal to such a range of level that can be received by that comparator 14.

The small-amplitude interface input circuit 10A in this embodiment comprises: a differential amplifier circuit 12 which receives at its separate input terminals such two signals transmitted via a transmission line that are mutually opposite in phase and different in voltage level; a level-shifting circuit 1A; and a comparator 14.

In this embodiment, the differential amplifier circuit 12 of the level-shifting circuit 1A and the comparator 14 of the small-amplitude interface input circuit 10A are the same as those described with reference to FIG. 9, while the level-shifting circuit 1A is the same as that described with reference to FIG. 1.

Therefore, description of a configuration of this embodiment is omitted here because like components are indicated by the same reference numerals.

Figure 3:
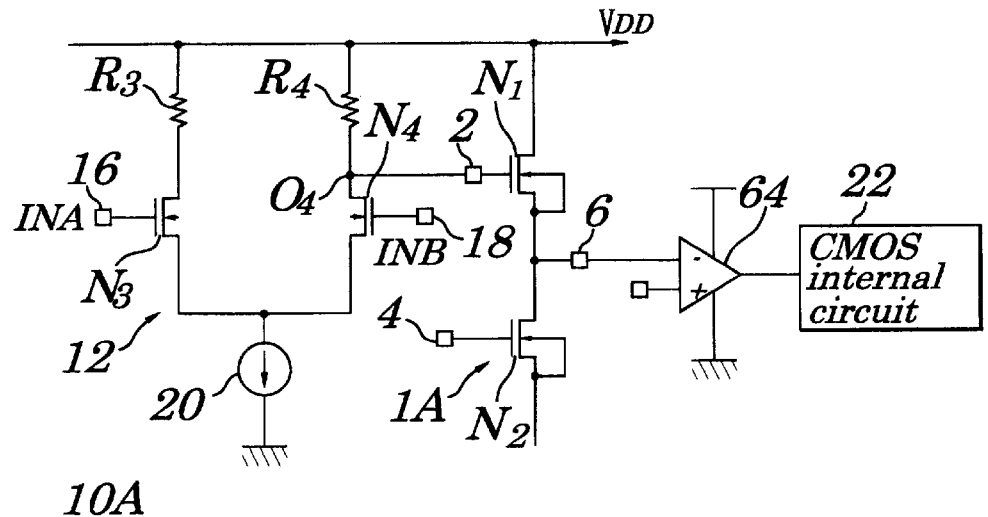
FIG. 3 is a circuit diagram showing a configuration of a small-amplitude interface input circuit according to a second embodiment of the present invention.

Next, the operations of this embodiment are described with reference to FIGS. 3 and 10.

Figure 9:
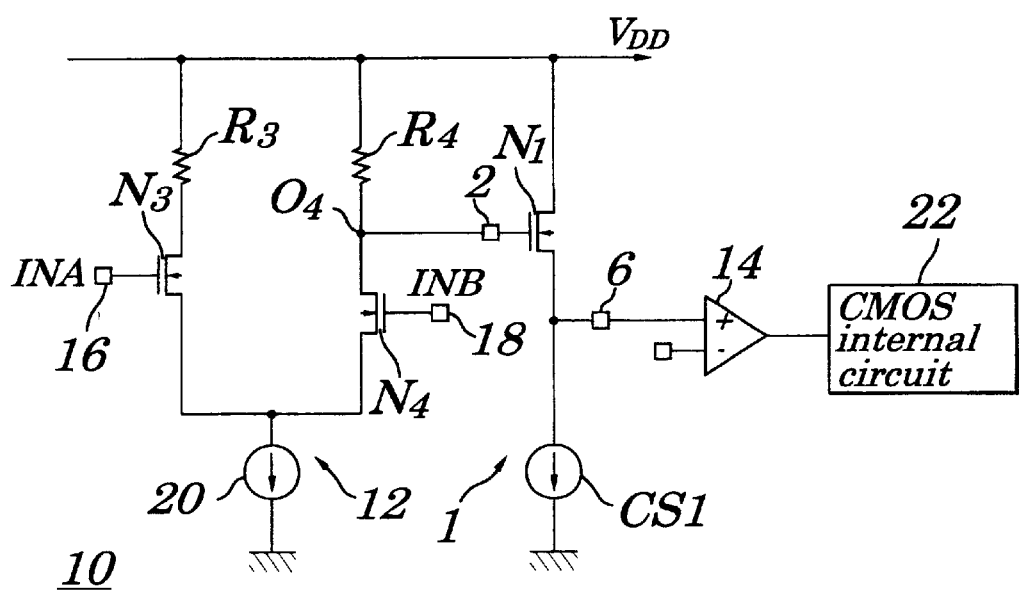
FIG. 9 is a circuit diagram showing a configuration of one conventional small-amplitude interface input circuit.
Figure 10:
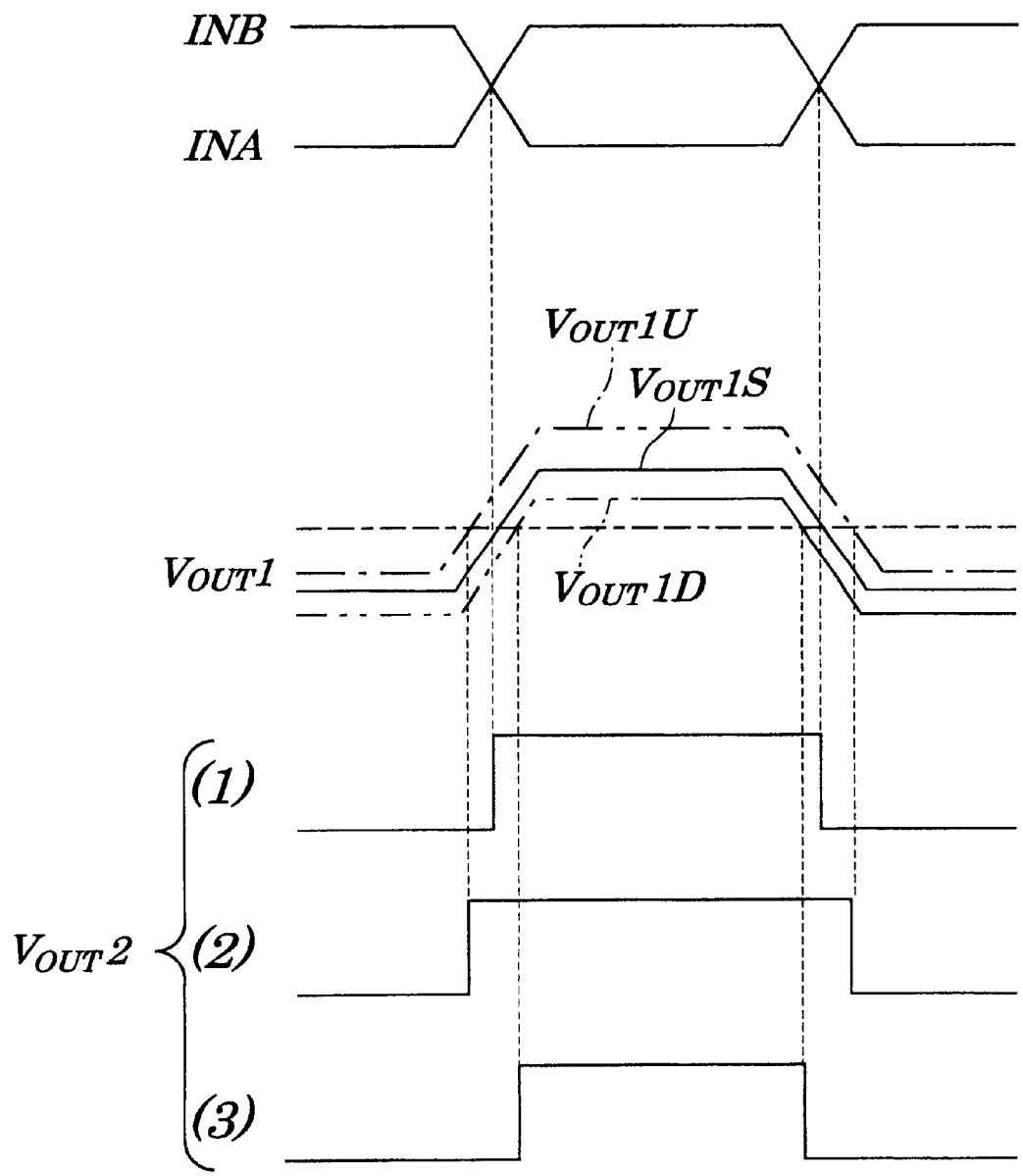
FIG. 10 shows operating waveforms of the same small-amplitude interface circuit as shown in FIG. 9.

In the level-shifting circuit 1A in this embodiment, as described with reference to FIG. 3 and FIG. 9, the differential amplifier circuit 12 receives at its input terminals 16 and 18 such two input signals INA and INB (which are shown in FIG. 10) which are mutually opposite in phase and different in voltage level. Then, the signal INB as differential-amplified is output from an output terminal 04 of the differential amplifier circuit 12. That signal INB is applied to the level-shifting circuit 1A at its input terminal 2. The level-shifting circuit 1A outputs a signal as level-shifted from its output terminal 6. In this case, the level-shifting quantity given by the level-shifting circuit 1A is enough, like in the case of the circuit shown in FIG. 9, to permit the concerned level of a signal input at the level-shifting circuit 1A to be received by the comparator 14.

As detailed with reference to FIGS. 1 and 2, the operations of level shifting by that level-shifting circuit 1A are not dependent on the manufacturing process, the operating temperature, nor the supply voltage.

Therefore, the signal output from the level-shifting circuit 1A is shifted by such a level-shifting quantity that it may not be dependent on the manufacturing process, the operating temperature, nor the supply voltage. Since such signal is supplied to the comparator 14 at its (−) input terminal, such a binary signal can be output from the comparator 14 as a skew-free binary signal that corresponds to the two input signals INA and INB mutually opposite in phase and different in voltage level, even if there are fluctuations in the manufacturing process, the operating temperature, or the supply voltage of the n-channel type MOSFETs $N_1$ and $N_2$ which compose the level-shifting circuit 1A.

Thus, according to this configuration, as in the small-amplitude interface input circuit 10 shown in FIG. 9, a signal input to the comparator 14 at its (−) input terminal is not stepped up or down in voltage like $V_{OUT}$ 1U or $V_{OUT}$ 1D shown in FIG. 10 by fluctuations in a level-shifting quantity of signals output from the level-shifting circuit 1A caused by fluctuations in the manufacturing process, the operating temperature, or the supply voltage, thus making it possible to supply a skew-free binary signal from the comparator 14 to a CMOS internal circuit 22.

Therefore, there is no possibility for the CMOS internal circuit to malfunction.

Also, as can be seen from Equation 20, the level-shifting quantity can be adjusted to an arbitrary set-point value by adjusting the constant voltage $V_R$. In addition, that setting need not change a current flowing through the NMOS transistors or the gate width W, thus inflicting, unlike the conventional embodiments, no disadvantage which brings about increases in power dissipation or deterioration in high-speed performance of the level-shifting circuit 1A.

Third Embodiment

In this embodiment, the level-shifting circuit 1A used in the first embodiment is applied between an input-stage differential amplifier circuit and an output-stage differential amplifier circuit in a small-amplitude interface input circuit, in order to match a voltage level of a signal output from the input-stage differential amplifier circuit with a voltage level of a signal input to the output-stage differential amplifier circuit.

Figure 4:
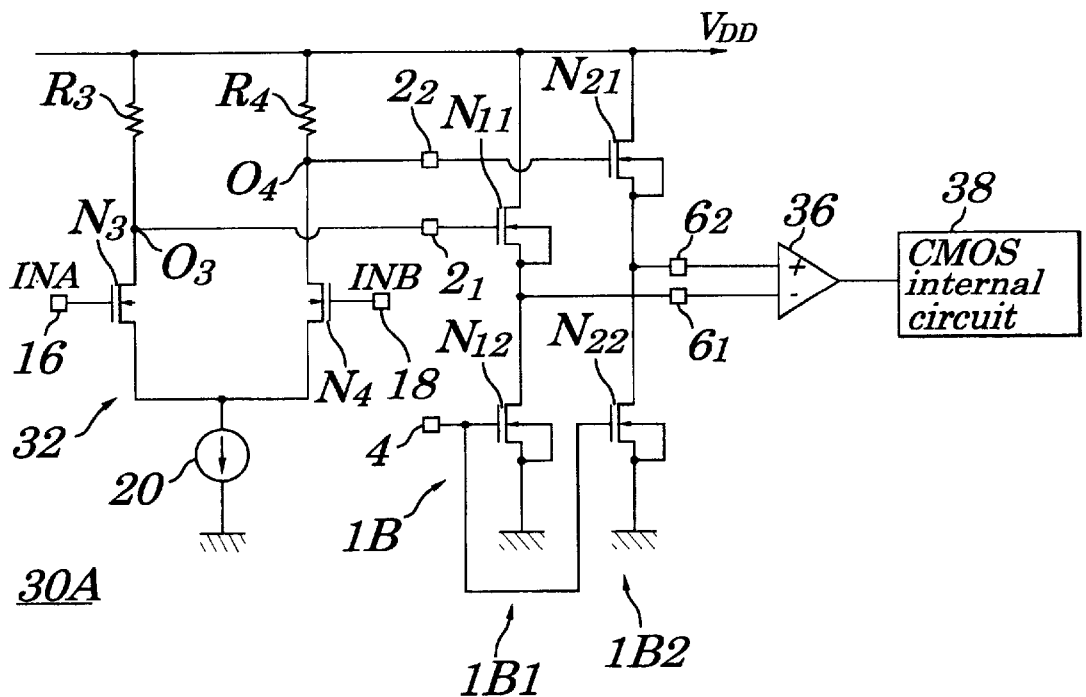
FIG. 4 is a circuit diagram showing a configuration of a small-amplitude interface input circuit according to a third embodiment of the present invention.

As shown in FIG. 4, since that level-shifting circuit 1B is formed together with the following-stage differential amplifier circuit 36 in the same chip and that differential amplifier circuit 36 is supplied with a $V_{DD}$ lower than a supply voltage for the level-shifting circuit 1B (e.g., 1.8V for the level-shifting circuit 1B versus 3V for the level-shifting circuit 1B), the level-shifting circuit 1B is used to shift the level of a signal supplied to the differential amplifier circuit 36 to such a range of level that can be received by the differential amplifier circuit 36.

The small-amplitude interface input circuit 30A in this embodiment comprises: a differential amplifier circuit 32 which received at its separate input terminals such two input signals transmitted via the transmission line that are mutually opposite in phase and different in voltage level; a level-shifting circuit 1B which is connected with two input terminals 21 and 22 which respectively correspond to two output terminals of the differential amplifier circuit 32; and another differential amplifier circuit 36 which are connected with input terminals which respectively correspond to two output terminals $6_1$ and $6_2$ of the level-shifting circuit 1B.

The differential amplifier circuits 32 and 36 are the same as those described with reference to FIG. 11.

A first level-shifting circuit 1B1 and a second level-shifting circuit 1B2 which compose the level-shifting circuit 1B are of the same configuration as that shown in FIG. 1, so that they are discriminated from each other by adding subscripts 1 and 2 to n-channel type MOSFETs composing the first and second level-shifting circuits 1B1 and 1B2 respectively; therefore, the description of these two level-shifting circuits 1B1 and 1B2 is omitted here.

Next, the connecting relationships among the differential amplifier circuits 32 and 36 and the level-shifting circuit 1B are described below.

An output terminal O3 of the differential amplifier circuit 32 is connected to the input terminal 21 of the first level-shifting circuit 1B1 and its output terminal O4, to the input terminal 22 of the second level-shifting circuit 1B2. The output terminal $6_1$ of the first level-shifting circuit 1B1 is connected to the (+) input terminal of the differential amplifier circuit 36 and the output terminal $6_2$ of the second level-shifting circuit 1B2, to the (−) input terminal of the differential amplifier circuit 36.

Next, the operations of this embodiment are described with reference to FIG. 4 as follows.

Two input signals INA and INB mutually opposite in phase and different in voltage level which are transmitted via the transmission Line are input to the differential amplifier circuit 32 at its input terminals 16 and 18 separately. These signals INA and INB are amplified at the differential amplifier circuit 32 and then applied to the gate of the n-channel type MOSFETs N11 and N21 of the levels-shifting circuit 1B respectively.

Then, two signals mutually opposite in phase and different in voltage level which are shifted by a predetermined level-shifting quantity are output from the output terminal $6_1$ of the level-shifting circuit 1B1 and the output terminal $6_2$ of the level-shifting circuit 1B2 respectively.

Figure 11:
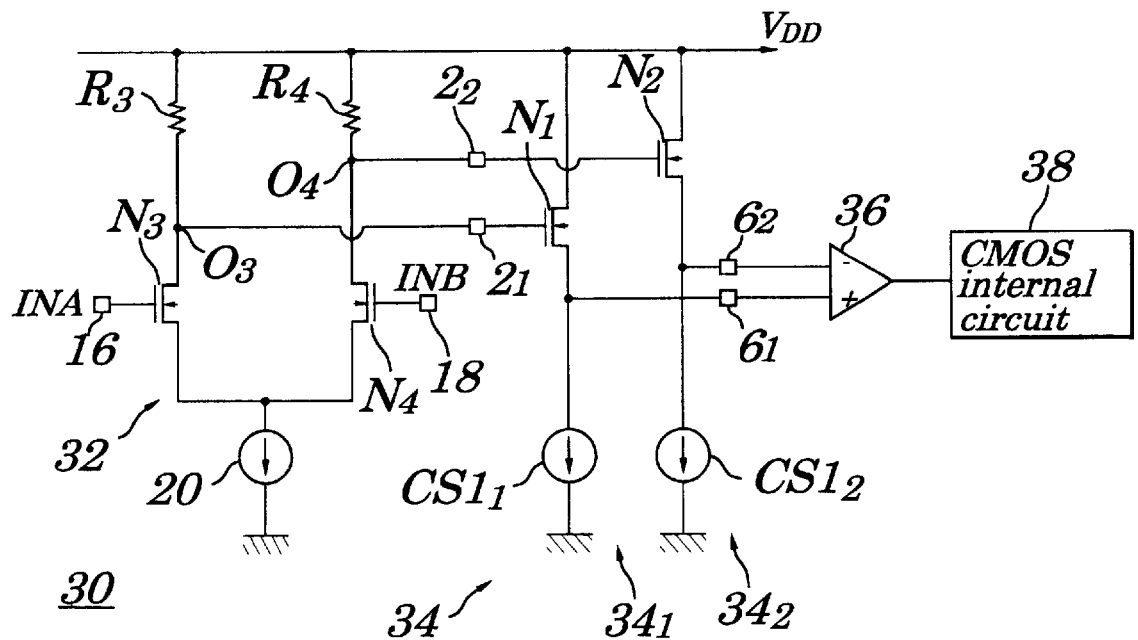
FIG. 11 is a circuit diagram showing a configuration of another conventional small-amplitude interface circuit.

A level-shifting quantity for signals output as level-shifted from the output terminals $6_1$ and $6_2$ of the level-shifting circuits 1B1 and 1B2 respectively is enough, like in the case of the circuit shown in FIG. 11, to permit the concerned level of a signal input at the level-shifting circuits 1B1 and 1B2 to be received by the differential amplifier circuit 36.

As detailed with reference to FIGS. 1 and 2, a level-shifting quantity by the level-shifting circuits 1B1 and 1B2 of that level-shifting circuit 1B are not dependent on the process or the temperature.

Therefore, the respective signals output from the separate level-shifting circuits 1B1 and 1B2 of the level-shifting circuit 1B are shifted by such a level-shifting quantity that they may not be dependent on the manufacturing process, the operating temperature, nor the supply voltage.

Since these signals are supplied to the differential amplifier circuit 36 at its (+) and (−) input terminals, such a binary signal can be output from the differential amplifier circuit 36 as a skew-free binary signal that corresponds to the two input signals INA and INB mutually opposite in phase and different in voltage level, even if there are fluctuations in the manufacturing process, the operating temperature, or the supply voltage of the n-channel type MOSFETs $N_{11}$, $N_{12}$, $N_{21}$, and $N_{22}$ which compose the level-shifting circuit.

Thus, according to this configuration, as in the small-amplitude interface input circuit 30 shown in FIG. 11, signals applied to the (+) and (−) input terminals of the differential amplifier circuit 36 are not stepped up or down in voltage like $V_{OUT}$ 1U or $V_{OUT}$ 1D shown in FIG. 10 by fluctuations in level-shifting quantity of signals output from the level-shifting circuit 34 caused by fluctuations in the manufacturing process, the operating temperature, or the supply voltage, thus making it possible to supply a skew-free binary signal from the differential amplifier circuit 36 to the CMOS internal circuit 38.

Therefore, there is no possibility for the CMOS internal circuit 38 to malfunction.

Also, as can be seen from Equation 20, the level-shifting quantity can be adjusted to an arbitrary set-point value by adjusting the constant voltage VR. In addition, that setting need not change a current flowing through the NMOS transistors or the gate width W, thus inflicting, unlike the conventional embodiments, no disadvantage which brings about increases in power dissipation or deterioration in high-speed performance of the level-shifting circuit.

Fourth Embodiment

In this embodiment, the level-shifting circuit used in the first embodiment is applied between each input terminal of a small-amplitude interface input circuit and the corresponding input terminal of an output-stage differential amplifier circuit, in order to match a voltage level of two input signals mutually opposite in phase and different in voltage level which are input via the transmission line to the small-amplitude interface input circuit at its two input terminals with a voltage level of signals input to the output-stage differential amplifier circuit at its respective input terminals. The reason why a level-shifting circuit 1C (See FIG. 5) is used in this embodiment is that if the differential amplifier circuit 36 connected at the stage following the level-shifting circuit 1C is supplied with a signal having a potential of the voltage source $V_{DD}$ or higher (e.g., if a signal having 2.5V as its signal amplitude center versus $V_{DD}$=1.8V is supplied via a bus line), it is rendered inoperative, so that to prevent such an event from occurring, a level of signals supplied to the differential amplifier circuit 36 must be shifted to such a range of level that can be received by the differential amplifier circuit 36.

The small-amplitude interface input circuit 40A in this embodiment comprises: a level-shifting circuit 1C which receives at its separate input terminals such two input signals that are mutually opposite in phase and different in voltage level; and a differential amplifier circuit 36 which are connected with input terminals which correspond to two output terminals of the level-shifting circuit 1C.

That differential amplifier circuit 36 is the same as that described with reference to FIG. 11.

A fist level-shifting circuit 1C1 and a second level-shifting circuit 1C2, which compose the level-shifting circuit 1C, are of the same configuration as that shown in FIG. 1, so that they are discriminated from each other by adding subscripts 1 and 2 to n-channel MOSFETs composing the first and second level-shifting circuits 1C1 and 1C2 respectively; therefore, the description of these two level-shifting circuits 1C1 and 1C2 is omitted here.

Next, the connecting relationships between the level-shifting circuit 1C and the differential amplifier circuit 36 are described below.

One of the two input terminals which receive via the transmission line such two input signals that are opposite in phase and different in voltage level acts also as the input terminal $2_1$ of the fist level-shifting circuit 1C1, while the other input terminal acts as the input terminal $2_2$ of the second level-shifting circuit 1C2. The output terminal $6_1$ of the first level-shifting circuit 1C1 is connected to the differential amplifier circuit 36 at its (+) input terminal, while the output terminal $6_2$ of the second level-shifting circuit 1C2 is connected to the differential amplifier circuit 36 at its (−) input terminal.

Figure 5:
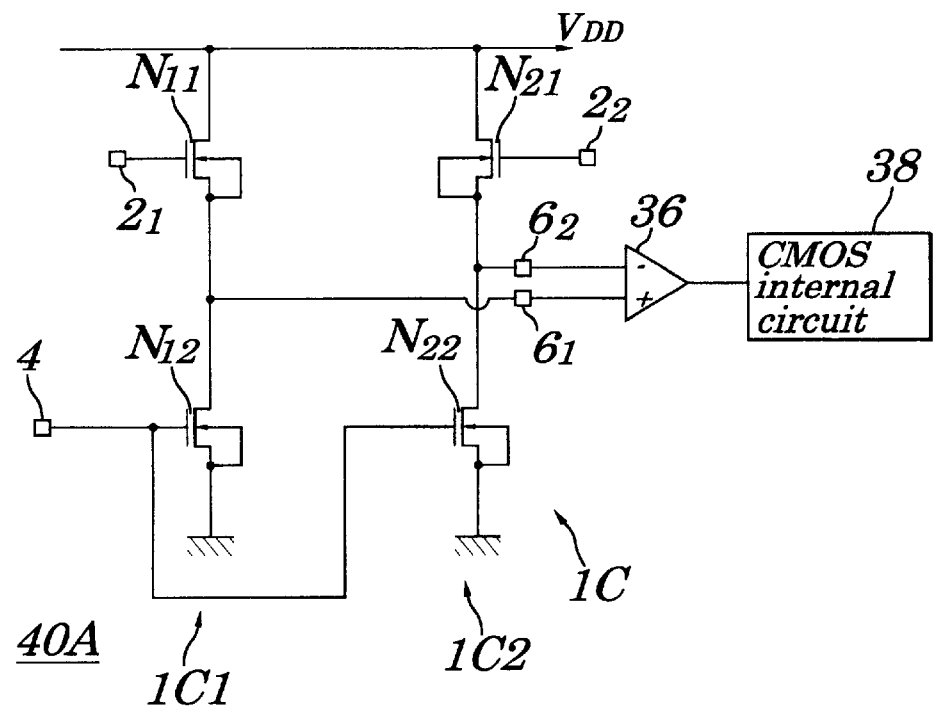
FIG. 5 is a circuit diagram showing a configuration of a small-amplitude interface input circuit according to a fourth embodiment of the present invention.

Next, the operations of this embodiment are described with reference to FIG. 5 as follow.

Two input signals INA and INB mutually opposite in phase and different in voltage level which are transmitted via the transmission line are applied to the level-shifting circuit 1C at its input terminals $2_1$ and $2_2$ separately. Then, two signals mutually opposite in phase and different in voltage level which are shifted by the respective same predetermined level-shifting quantity are output from the output terminal $6_1$ of the level-shifting circuit 1C1 and the output terminal $6_2$ of the level-shifting circuit 1C2 respectively. The level-shifting quantity for signals output as level-shifted from the output terminals $6_1$ and $6_2$ respectively of the level-shifting circuits 1C1 and 1C2 of the level-shifting circuit 1C is enough, like in the case of the circuit shown in FIG. 12, to the concerned level of a signal input at the level-shifting circuits 1C1 and 1C2 to be received by the differential amplifier circuit 36.

As detailed with reference to FIGS. 1 and 2, the operations of level shifting by the level-shifting circuits 1C1 and 1C2 of that level-shifting circuit 1C are not dependent on the process or the temperature.

Therefore, the respective signals output from the separate level-shifting circuits 1C1 and 1C2 of the level-shifting circuit 1C are shifted by such a level-shifting quantity that they may not be dependent on the manufacturing process, the operating temperature, nor the supply voltage.

Since these signals are supplied to the differential amplifier circuit 36 at its (+) and (−) input terminals, such a binary signal can be output from the differential amplifier circuit 36 as a skew-free binary signal that corresponds to the two input signals INA and INB which are mutually opposite in phase and different in voltage level, even if there are fluctuations in the manufacturing process, the operating temperature, or the supply voltage of the n-channel MOSFETs $N_{11}$, $N_{12}$, $N_{21}$, and $N_{22}$ which compose the level-shifting circuit.

Figure 12:
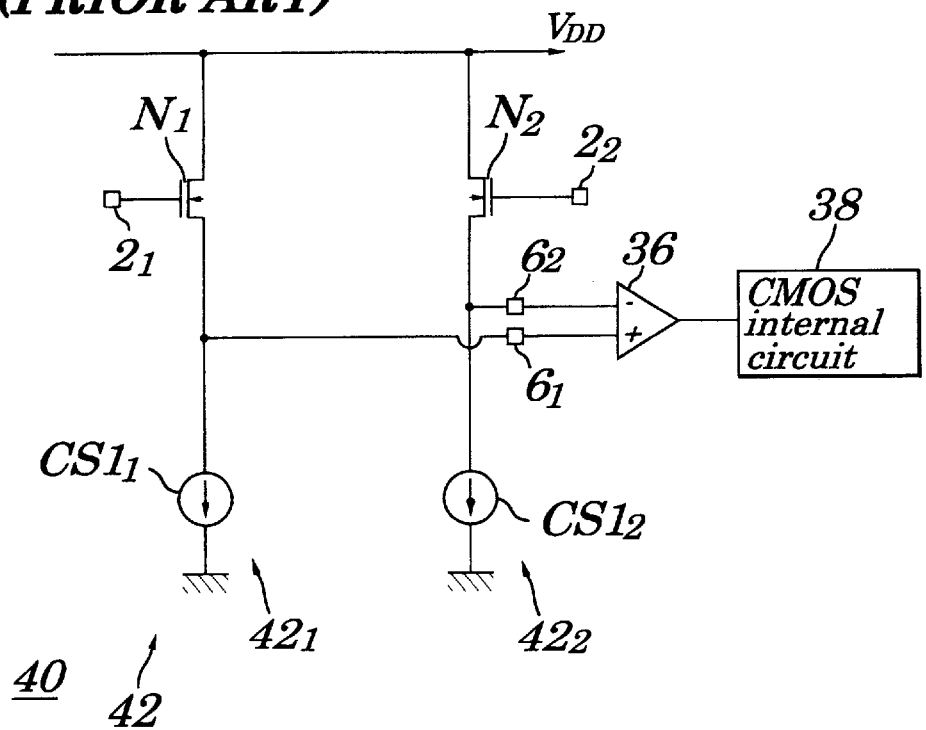
FIG. 12 is a circuit diagram showing a configuration of still another conventional small-amplitude interface circuit.
Figure 13:
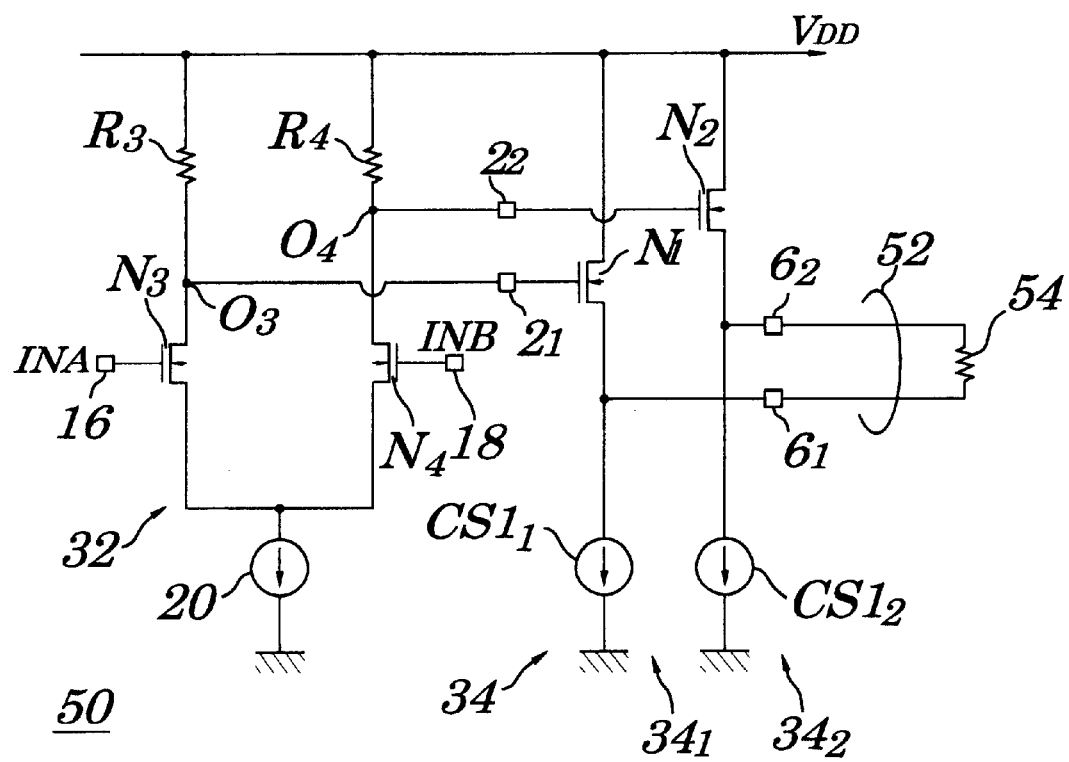
FIG. 13 is a circuit diagram showing a configuration of still another conventional small-amplitude interface circuit.

Thus, according to this configuration, as in the small-amplitude interface input circuit 40 shown in FIG. 12, signals applied to the (+) and (−) input terminals of the differential amplifier circuit 36 are not stepped up or down in voltage like $V_{OUT}$ 1U or $V_{OUT}$ 1D shown in FIG. 10 just because of fluctuations in the level-shifting quantity of signals output from the level-shifting circuit 42 caused by fluctuations in the manufacturing process, the operating temperature, or the supply voltage, thus making it possible to supply a skew-free binary signal from the differential amplifier circuit 36 to the CMOS internal circuit 38.

Therefore, there is no possibility for the CMOS internal circuit 38 to malfunction.

Also, as can be seen from Equation 20, the level-shifting quantity can be adjusted to an arbitrary set-point value by adjusting the constant voltage $V_R$. In addition, that setting need not change a current flowing through the NMOS transistors or the gate width W, thus inflicting, unlike the conventional embodiments, no disadvantage which brings about increases in power dissipation or deterioration in high-speed performance of the level-shifting circuit.

Fifth Embodiment

Figure 6:
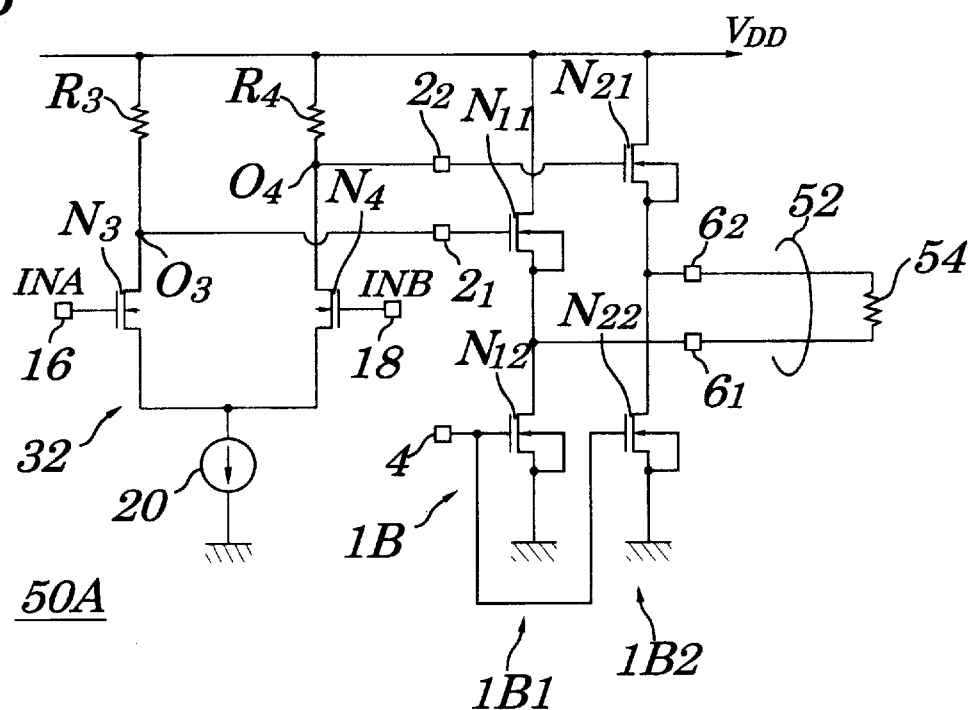
FIG. 6 is a circuit diagram showing a configuration of a small-amplitude interface output circuit according to a fifth embodiment of the present invention.
Figure 7:
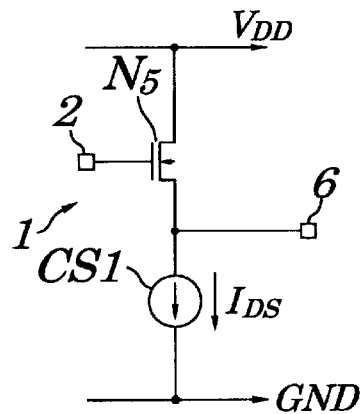
FIG. 7 is a circuit diagram showing a configuration of a conventional level-shifting circuit.
Figure 8A:
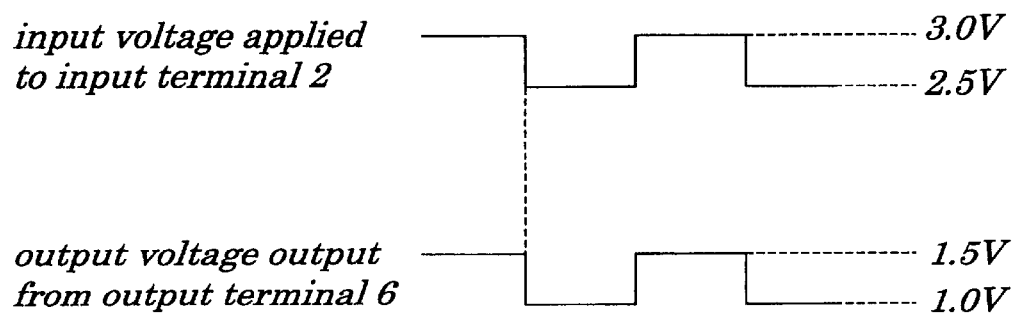
FIGS. 8A and 8B show operating waveforms of the same level-shifting circuit as shown in FIG. 7.
Figure 8B:
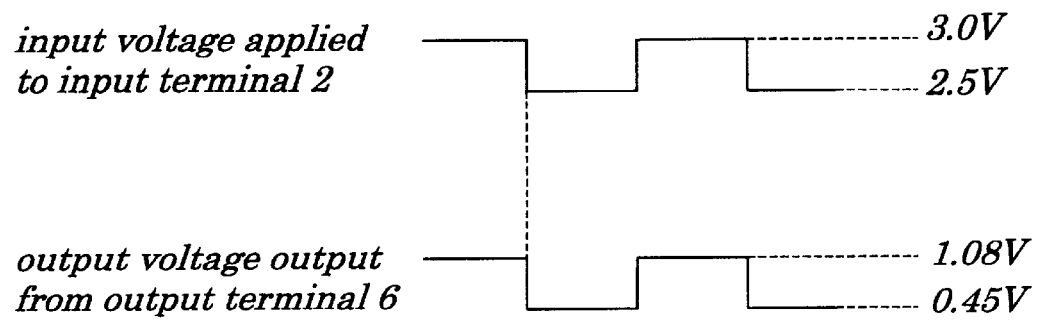

As shown in FIG. 6, in this embodiment, the level-shifting circuit 1A used in the first embodiment is applied between an input-stage differential amplifier circuit 32 and a load resistor 54 of a small-amplitude interface output circuit 50A, in order to match a voltage level of a signal output from the input-stage differential amplifier circuit 32 with a voltage level of a signal supplied to the load resistor 54.

This small-amplitude interface output circuit 50A in this embodiment comprises: the differential amplifier circuit 32 which receives at its separate input terminals 16 and 18 such input signals that are mutually opposite in phase and different in voltage level; and a level-shifting circuit 1B which is connected with input terminals $2_1$ and $2_2$ which correspond to two output terminals $O_3$ and $O_4$ of the differential amplifier circuit 32, in such a configuration that the two output terminals $6_1$ and $6_2$ of the level-shifting circuit 1B are connected to the transmission line 52.

The differential amplifier circuit 32 is the same as that described with reference to FIG. 11 and the level-shifting circuit 1B, the same as that described with reference with FIG. 4.

Therefore, description of a configuration of this embodiment is omitted here because like components are indicated by the same reference numerals.

Next, the operations of this embodiment are described with reference to FIG. 6.

Two input signals INA and INB mutually opposite in phase and different in voltage level are applied to the differential amplifier circuit at its input terminals 16 and 18 respectively. These signals INA and INB are amplified at the differential amplifier circuit 32 and then applied to the gate of the n-channel MOSFETs $N_{11}$ and $N_{21}$ of the level-shifting circuit 1B respectively.

Then, two signals mutually opposite in phase and different in voltage level which are shifted by a predetermined level-shifting quantity are output from the output terminals $6_1$ of the first level-shifting circuit 1B1 and the output terminals $6_2$ of the second level-shifting circuit 1B2 respectively.

In this case, the level-shifting quantity for signals output as level-shifted from the output terminals $6_1$ and $6_2$ of the first and second level-shifting circuits 1B1 and 1B2 respectively is enough to permit the level of signals input at the respective level-shifting circuits 1B1 and 1B2 of the level-shifting circuit 1B to be received by the load resistor 54, as specified in terms of level.

As detailed with reference to FIGS. 1 and 2, the operations of level shifting by these respective level-shifting circuits 1B1 and 1B2 of the level-shifting circuit 1B are not dependent on the manufacturing process, the operating temperature, not the supply voltage.

Therefore, respective signals output from the level-shifting circuits 1B1 and 1B2 of the level-shifting circuit 1B respectively are shifted by such a level-shifting quantity that they may not be dependent on the manufacturing process, the operating temperature, not the supply voltage.

These two signals are supplied to the load resistor 54 via the transmission line 52.

Thus, according to this configuration, even if there are fluctuations in the manufacturing process, the operating temperature, or the supply voltage of the n-channel type MOSFETs $N_{11}$, $N_{12}$, $N_{21}$, and $N_{22}$ which compose the level-shifting circuit 1B, the load circuit 54 can be supplied with a signal having a specified level-shifting quantity, thus being prevented from malfunctioning.

Also, as can be seen from Equation 20, the level-shifting quantity can be adjusted to an arbitrary set-point value by adjusting the constant voltage $V_R$. In addition, that setting need not change a current flowing through the NMOS transistors or the gate width W, thus inflicting, unlike the conventional embodiments, no disadvantage which brings about increases in power dissipation or deterioration in high-speed performance of the level-shifting circuit.

It is apparent that the present invention is not limited to the above embodiments but may be changed and modified without departing from the scope and spirit of the invention.

Although, for example, the above-mentioned embodiments have been described supposing $W_1/L_{1=W2}/L_2$, that supposition may be changed to $(1/T_{OX1})TW_1/L_{1=}(1/T_{OX2})W_2/L_2$.

Also, in place of the n-channel type MOSFETs used in the above-mentioned embodiments, p-channel type MOSFETs may be used in those embodiments.

Also, although the back-gate and the source are interconnected in the above-mentioned embodiments, they may not be interconnected within a tolerable fluctuation range of the level-shifting quantity.

Also, in place of the silicon oxide film used as the gate insulator film of the MOSFETs in the above-mentioned embodiments, other gate oxide films may be used.

Finally, the present application claims the priority based on Japanese Patent Application No. Hei10-356591 filed on Dec. 15, 1998, which is herein incorporated by reference.

What is claimed is:

1. A level-shifting circuit in which a source of a first insulated-gate transistor is connected with a drain of a second insulated-gate transistor having a same conductivity type as said first insulated-gate transistor, to apply an input signal to a gate of said first insulated-gate transistor in order to output an output signal obtained by level-shifting said input signal by a desired quantity from an interconnection point between said first insulated-gate transistor and said second insulated-gate transistor, wherein said first insulated-gate transistor and said second insulated-gate transistor share a same value of a ratio of a gate channel width to a gate channel length, in such a configuration that a constant voltage is applied to a gate of said second insulated-gate transistor.

2. The level-shifting circuit according to claim 1, wherein said gate of said second insulated-gate transistor is provided with said constant voltage which is not affected by a variation in a property, an operating temperature, or an operating voltage which is caused by a fluctuation in a manufacturing process for said first insulated-gate transistor and said second insulated-gate transistor.

3. The level-shifting circuit according to claim 1, wherein said two insulated-gate transistors share a same value given by a following Equation:

$$(1/T) \times W/L.$$

where T is a thickness of a gate insulator film, W is a gate channel width, and L is a gate channel length, which apply to subsequent claims.

4. The level-shifting circuit according to claim 1, wherein said two insulated-gate transistors shares a value give by a following Equation:

$$\mu \times \in_r \times (S/T) \times W/L.$$

where $\mu$ is a surface mobility, $\in_r$ is a dielectric constant of a gate insulator film, and S is a unit area of a gate channel, which apply to subsequent claims.

5. The level-shifting circuit according to claim 1, wherein said two insulated-gate transistors are formed on a same substrate, in such a configuration that said constant voltage may be supplied from an outside of said substrate.

6. The level-shifting circuit according to claim 1, wherein said two insulated-gate transistors are formed on a same substrate, in such a configuration that said constant voltage may be an arbitrary constant voltage which is created based on a band-gap reference voltage which is generated in said substrate.

7. The level-shifting circuit according to claim 1, wherein said two insulated-gate transistors are formed on a same substrate, in such a configuration that, in each of said insulated-gate transistors, a source and a back-gate are interconnected.

8. The level-shifting circuit according to claim 1, wherein said two insulated-gate transistors are formed on a same substrate, in such a configuration that, in neither of said insulated-gate transistors, a source and a back-gate are interconnected.

9. The level-shifting circuit according to claim 1, wherein said two insulated-gate transistors are formed on a same substrate, in such a configuration that a back-gate of each of said insulated-gate transistors is clamped to a highest or lowest potential supplied to said substrate.

10. An input circuit which shifts a level of a voltage of a signal output from a preceding-stage circuit by as much as a level-shifting quantity to such an input operating level as required by a following-stage circuit which is provided with an operating voltage different from an operating voltage for said preceding-stage circuit, wherein said input circuit comprises a level-shifting circuit in which a first insulated-gate transistor and a second insulated-gate transistor having a same conductivity type as said first insulated-gate transistor are interconnected to apply an input signal to a gate of said first insulated-gate transistor, in order to output an output signal obtained by shifting a level of said input signal by a desired quantity from an interconnection point between said first insulated-gate transistor and said second insulated-gate transistor; and said first insulated-gate transistor and said second insulated-gate transistor share a same value of a ratio of a gate channel width to a gate channel length, in such a configuration that a constant voltage is applied to a gate of said second insulated-gate transistor.

11. The input circuit according to claim 10, which has such a configuration that a gate of said second insulated-gate transistor may be provided with said constant voltage which is not affected by a variation in a property or an operating temperature caused by a fluctuation in a manufacturing process of said first insulated-gate transistor and said second insulated-gate transistor.

12. The input circuit according to claim 10, wherein said two insulated-gate transistors share a same value which is given by a following Equation:

$$(1/T) \times W/L.$$

13. The input circuit according to claim 10, wherein said two insulated-gate transistors share a same value which is given by a following Equation:

$$\mu \times \in_r \times (S/T) \times W/L.$$

14. The input circuit according to claim 10, wherein said two insulated-gate transistors are formed on a same substrate, in such a configuration that said constant voltage may be supplied from an outside of said substrate.

15. The input circuit according to claim 10, wherein said two insulated-gate transistors are formed on a same substrate, in such a configuration that said constant voltage may be an arbitrary constant voltage created based on a band-gap reference voltage generated in said substrate.

16. The input circuit according to claim 10, wherein said two insulated-gate transistors are formed on a same substrate, in such a configuration that in each of said insulated-gate transistors, a source and a back-gate are interconnected.

17. The input circuit according to claim 10, wherein said two insulated-gate transistors are formed on a same substrate, in such a configuration that in neither of said insulated-gate transistors, a source and a gate are interconnected.

18. The input circuit according to claim 10, wherein said two insulated-gate transistors are formed on a same substrate, in such a configuration that in each of said insulated-gate transistors, a back-gate is clamped to a highest-level or lowest-level potential supplied to said substrate.

19. The input circuit according to claim 10, wherein said preceding-stage circuit is a differential amplifier circuit which is supplied with two signals mutually opposite in phase and different in voltage level, to output one output signal to one output terminal, said level-shifting circuit has one input terminal and one output terminal, said following-stage circuit is a comparator which is provided with a reference voltage at one input terminal thereof, said one output of said differential amplifier circuit is connected to one input terminal of said level-shifting circuit, and one output terminal of said level-shifting circuit is connected to the other input terminal of said comparator.

20. The input circuit according to claim 10, wherein said preceding-stage circuit is a differential amplifier circuit which has two input terminals and two output terminals, said level-shifting circuit has two input terminals and two output terminals, said following-stage circuit is a differential amplifier circuit which has two input terminals, said preceding-stage amplifier circuit is supplied with two input signals opposite in phase and different in voltage level and has two output terminals thereof connected to corresponding input terminals of said level-shifting circuit, and said two output terminals of said level-shifting circuit are connected to corresponding input terminals of said following-stage differential amplifier circuit.

21. An input circuit which shifts by a level-shifting quantity a level of a voltage of input signals which is required as an input operating level of an output stage and then supplies a signal thus level-shifted to said output stage, wherein said input circuit comprises a level-shifting circuit in which a source of a first insulated-gate transistor and a drain of a second insulated-gate transistor having a same conductivity type as said first insulated-gate transistor are interconnected to apply an input signal to a gate of said first insulated-gate transistor, in order to output an output signal obtained by shifting a level of said input signal by a desired quantity from an interconnection point between said first insulated-gate transistor and said second insulated-gate transistor; and said first insulated-gate transistor and said second insulated-gate transistor share a same value of a ratio of a gate channel width to a gate channel length, in such a way that a constant voltage is applied to a gate of said second insulated-gate transistor.

22. The input circuit according to claim 21, which has such a configuration that a gate of said second insulated-gate transistor may be provided with said constant voltage which is not affected by a variation in a property or an operating temperature caused by a fluctuation in a manufacturing process for said first insulated-gate transistor and said second insulated-gate transistor.

23. The input circuit according to claim 21, wherein said two insulated-gate transistors share a same value given by a following Equation:

$$(1/T) \times W/L.$$

24. The input circuit according to claim 21, wherein said two insulated-gate transistors share a same value given by a following Equation:

$$\mu \times \in_r \times (S/T) \times W/L.$$

25. The input circuit according to claim 21, wherein said two insulated-gate transistors are formed on a same substrate, in such a configuration that said constant voltage may be applied from an outside of said substrate.

26. The input circuit according to claim 21, wherein said two insulated-gate transistors are formed on a same substrate, in such a configuration that said constant voltage may be an arbitrary constant voltage created based on a band-gap reference voltage generated in said substrate.

27. The input circuit according to claim 21, wherein said two insulated-gate transistors are formed on a same substrate, in such a configuration that in each of said insulated-gate transistors, a source and a back-gate are interconnected.

28. The input circuit according to claim 21, wherein said two insulated-gate transistors are formed on a same substrate, in such a configuration that in neither of said insulated-gate transistors, a source and a back-gate are interconnected.

29. The input circuit according to claim 21, wherein said two insulated-gate transistors are formed on a same substrate, in such a configuration that a back-gate of each of said insulated-gate transistors is clamped to a highest-level or lowest-level potential supplied to said substrate.

30. The input circuit according to claim 21, wherein said level-shifting circuit has two input terminals provided with two signals opposite in phase and different in voltage level are supplied, and two output terminals, said output stage is a differential amplifier circuit which has two input terminals, and said two output terminals of said level-shifting circuit are connected to corresponding input terminals of said output stage.

31. An output circuit which shifts a level of a signal output from an input stage by a predetermined level-shifting quantity and then outputs said signal, wherein said output circuit comprises a level-shifting circuit in which a source of a first insulated-gate transistor and a drain of a second insulated-gate transistor having a same conductivity type as said first insulated-gate transistor to apply an input signal to a gate of said first insulated-gate transistor, in order to output an output signal obtained by shifting a level of said input signal by a desired quantity from an interconnection point between said first insulated-gate transistor and said second insulated-gate transistor; and said first insulated-gate transistor and said second insulated-gate transistor share a same value of a ratio of gate channel width to a gate channel length, in such a configuration that a constant voltage is applied to a gate of said second insulated-gate transistor.

32. The output circuit according to claim 31, wherein said gate of said second insulated-gate transistor is provided with said constant voltage which is not affected by a variation in a property or an operating temperature caused by a fluctuation in a manufacturing process for said first insulated-gate transistor and said second insulated-gate transistor.

33. The output circuit according to claim 31, wherein said two insulated-gate transistors share a same value given by a following Equation:

$$(1/T) \times W/L.$$

34. The output circuit according to claim 32, wherein said two insulated-gate transistors share a same value given by following Equation, in such a configuration that a gate of the other insulated-gate transistor may be provided with a constant voltage which is not affected by a fluctuation in a process or a temperature:

$$\mu \times \in_r (S/T) \times W/L.$$

35. The output circuit according to claim 31, wherein said two insulated-gate transistors are formed on a same substrate, in such a configuration that said constant voltage may be supplied from an outside of said substrate.

36. The output circuit according to claim 31, wherein said two insulated-gate transistors are formed on a same substrate, in such a configuration that said constant voltage may be an arbitrary constant voltage created based on a band-gap reference voltage generated in said substrate.

37. The input circuit according to claim 31, wherein said two insulated-gate transistors are formed on a same substrate, in such a configuration that in each of said insulated-gate transistors, a source and a back-gate are interconnected.

38. The input circuit according to claims 31, wherein said two insulated-gate transistors are formed on a same substrate, in such a configuration that in neither of said insulated-gate transistors, a source and a back-gate are interconnected.

39. The output circuit according to claim 31, wherein a back-gate of each of said insulated-gate transistors is clamped to a highest-level or lowest-level potential supplied to said substrate.

40. The output circuit according to claims 31, wherein said input stage is a differential amplifier circuit which has two input terminals and two output terminals, said level-shifting circuit has two input terminals and two output terminals which are connected to two input terminals of a load circuit, and said differential amplifier circuit has said two input terminals thereof supplied with two signals which are mutually opposite in phase and different in voltage level and said two output terminals thereof connected to said two input terminals of said level-shifting circuit.

41. A level-shifting circuit, comprising:

a first insulated-gate transistor having a gate for receiving an input signal to be level-shifted;

a second insulated-gate transistor having a drain connected to a source of the first insulated-gate transistor;

a voltage source connected to a gate of the second insulated-gate transistor, said voltage source inputting a constant voltage into the gate of the second insulated-gate transistor;

an output terminal between the first insulated-gate transistor and the second insulted-gate transistor, said output terminal outputting a predetermined level-shifted value.

42. The level-shifting circuit according to claim 41, wherein said first insulated-gate transistor and said second insulated-gate transistor are of a same conductivity type.

43. The level-shifting circuit according to claim 42, wherein the first insulated-gate transistor and the second insulated-gate transistor have a same value of a ratio of a gate channel width to a gate channel length.

44. The level-shifting circuit according to claim 41, wherein the constant voltage input by said voltage source into the gate of the second insulated-gate transistor is not affected by variations in a manufacturing process used to form the first and second insulated-gate transistors, an operating temperature of said circuit, and a supply voltage to said circuit.

45. A method of level-shifting an input signal, comprising:

providing a first insulated-gate transistor and a second insulated-gate transistor, said second insulated-gate transistor having a drain connected to a source of said first insulated-gate transistor;

inputting said input signal into a gate of a first insulated-gate transistor;

inputting a constant voltage value into a gate of the second insulated-gate transistor; and outputting a predetermined level-shifted value from a node between the first insulated-gate transistor and the second insulted-gate transistor.

46. The method according to claim 45, wherein said first insulated-gate transistor and said second insulated-gate transistor being of a same conductivity type.

47. The method according to claim 46, wherein said providing step includes:

setting a ratio of a gate channel width to a gate channel length of said first insulated-gate transistor equal to a ratio of a gate channel width to a gate channel length of said second insulated-gate transistor.

48. The method according to claim 46, wherein the constant voltage input by said voltage source into the gate of the secobd insulated-gate transistor is a voltage which is not affected by varations in a manufacturing process used to form the first and second insulated-gate transistors, an operating temperature of said circuit, and a supply voltage to said circuit.

49. The method according to claim 46, further comprising:

adjusting said predetermined level-shifted value by varying said constant voltage value.

* * * * *